(12) United States Patent
Bircumshaw et al.

(10) Patent No.: US 6,940,370 B2
(45) Date of Patent: Sep. 6, 2005

(54) MEMS RESONATOR AND METHOD OF MAKING SAME

(75) Inventors: Brian L. Bircumshaw, San Diego, CA (US); Oliver M. O'Reilly, Berkeley, CA (US); Albert P. Pisano, Danville, CA (US)

(73) Assignee: The Regents of the University of California, Oakland, CA (US)

( * ) Notice: Subject to any disclaimer, the term of this patent is extended or adjusted under 35 U.S.C. 154(b) by 348 days.

(21) Appl. No.: 10/140,137

(22) Filed: May 6, 2002

(65) Prior Publication Data

US 2004/0113722 A1 Jun. 17, 2004

(51) Int. Cl.[7] .......................... H03H 9/205; H03H 9/00
(52) U.S. Cl. ...................................... 333/197; 333/186
(58) Field of Search ................................ 333/186, 187, 333/188, 189, 190, 191, 192, 197, 199; 702/33, 34, 35, 117; 73/514.29, 514.36, 514.37; 331/154

(56) References Cited

U.S. PATENT DOCUMENTS

| | | | | |
|---|---|---|---|---|
| 5,948,981 A | * | 9/1999 | Woodruff | 73/514.29 |
| 6,487,864 B1 | * | 12/2002 | Platt et al. | 62/3.2 |
| 6,542,829 B1 | * | 4/2003 | Gupta | 702/33 |
| 6,543,286 B2 | * | 4/2003 | Garverick et al. | 73/514.18 |
| 6,569,754 B2 | * | 5/2003 | Wong et al. | 438/612 |
| 6,577,040 B2 | * | 6/2003 | Nguyen | 310/309 |

OTHER PUBLICATIONS

Clark, John R. et al., "High–Q VHF Micromechanical Contour–Mode Disk Resonators," *Technical Digest*, IEEE Int. Electron Devices Meeting, San Francisco, CA, pp. 493–496, Dec. 11–13, 2000.

Hsu, W.-T, et al., "Q–Optimized Lateral Free–Free Beam Micromechanical Resonators," *Digest of Technical Papers*, the 11th Int. Conf. on Solid–State Sensors & Actuators (Transducers'01), Munich, Germany, pp. 1110–1113, Jun. 10–14, 2001.

Nguyen, C.T.–C., "Vibrating RF MEMS for Low Power Wireless Communications (invited)," *Proceedings*, 2000 Int. MEMS Workshop (iMEMS'01), Singapore, pp. 21–34, Jul. 4–6, 2001.

Nguyen, C.T.–C., "Transceiver Front–End Architectures Using Vibrating Micromechanical Signal Processors (invited)," *Dig. of Papers*, Topical Meeeting on Silicon Monolithic Integrated Circuits in RF Systems, pp. 23–32, Sep. 12–14, 2001.

* cited by examiner

*Primary Examiner*—Michael Tokar
*Assistant Examiner*—Linh V Nguyen
(74) *Attorney, Agent, or Firm*—Beyer Weaver & Thomas LLP (57) ABSTRACT

A MEMS resonater employs a bulk longitudinal resonating mass supported by opposing tethers above a substrate with primary capacitive plates spaced from end surfaces of the resonating mass and supported on the substrate. Any number of secondary capacitive plates can be spaced from side surfaces of the resonating mass for detecting transverse vibrations. The secondary capacitive plates can be shaped to conform to the mode of the transverse vibration. The sensor is readily fabricated using a two-mask self-aligned process, or a one-mask self-aligned process with timed etch.

23 Claims, 8 Drawing Sheets

MEMS RESONATOR AND METHOD OF MAKING SAME

BACKGROUND OF THE INVENTION

This invention relates generally to mechanical resonators, and more particularly the invention relates to a microresonator structure and method of fabricating the structure.

A mechanical resonating structure or resonator functions as a stable or tunable frequency source which can be used as a timing device, a filter, or as a carrier frequency in communications. Mechanical filters primarily comprise macroscopic quartz and ceramic resonators, while a microelectromechanical system (MEMS) resonator utilizes a clamped-clamped or free-free beam, see Nguyen "Vibrating RF MEMS for Low-Power Wireless Communications," *Proc.*, 2000 *International MEMS Workshop*, Singapore, Jul. 4–6, 2001, pp. 21–34, for example. The Nguyen free-free resonator, for instance, is a cantilever structure utilizing a polycrystalline silicon (poly-silicon) free-free beam fabricated using semiconductor processing techniques. The Nguyen free-free structure utilizes four support beams attached at the quarter wavelength nodes of the flexural beam. The four support beams are anchored to the substrate.

The present invention is directed to a MEMS resonator having three-dimensional resonance vibration with a high mechanical quality (Q) factor and which is readily fabricated using conventional semiconductor manufacturing processes.

BRIEF SUMMARY OF THE INVENTION

In accordance with the invention, the MEMS resonator comprises a resonating mass having a longitudinal axis and which is suspended above a substrate via tethers extending from opposing sides perpendicular to the longitudinal axis. The tethers are anchored to the substrate at points spaced from the resonating mass. The resonating mass can have virtually any cross-sectional shape, including but not limited to: rectangular, trapezoidal, elliptical, circular, and triangular. Present semiconductor processing techniques favor rectangular and trapezoidal cross-sections, though manufacturing techniques may evolve to enable other cross-sections, including two-dimensionally varying cross-section (i.e., an arbitrary cross-section). Capacitive plates cooperatively function with opposing surfaces of the resonating mass to establish vibrations in the mass and to capacitively detect signals at the resonant frequency of the mass. The capacitive plates can be spaced from opposing end surfaces along the longitudinal axis and, additionally, capacitive plates can be placed perpendicular to the longitudinal axis and spaced from sidewalls of the resonating mass.

The MEMS resonator is readily fabricated in a two-mask self-aligned process using conventional semiconductor manufacturing techniques. The resonating mass can comprise a structural material such as polycrystalline silicon (poly-silicon), polycrystalline silicon-germanium (poly-silicon-germanium), and polycrystalline silicon-carbide (poly-silicon-carbide), which are formed on a sacrificial layer such as silicon oxide on a supporting substrate. After the structural material is suitably shaped by etching, the underlying material is preferentially etched whereby the resonating mass and support tethers are suspended above the substrate except for portions of the supporting tethers which are anchored to the substrate. The capacitive plates are formed when the resonating mass is formed.

The MEMS resonator can also be fabricated in a one-mask self-aligned process using conventional semiconductor manufacturing techniques. The resonating mass can comprise a structural material such as poly-silicon, poly-silicon-germanium, and poly-silicon-carbide, which are formed on a sacrificial layer such as silicon oxide on a supporting substrate. After the structural material is suitably shaped by etching, the underlying material is preferentially etched for a specific time whereby the resonating mass and support tethers are suspended above the substrate except for portions of the supporting tethers which are anchored to the substrate. The capacitive plates are formed when the resonating mass is formed.

The invention and objects and features thereof will be more readily apparent from the following description and appended claims when taken with the drawings.

BRIEF DESCRIPTION OF THE DRAWINGS

FIG. 11 also illustrates the transverse component $V(x)$ of the mode shape of vibration of the resonating mass of FIG. 9.

DETAILED DESCRIPTION OF THE INVENTION

Figure 1A:
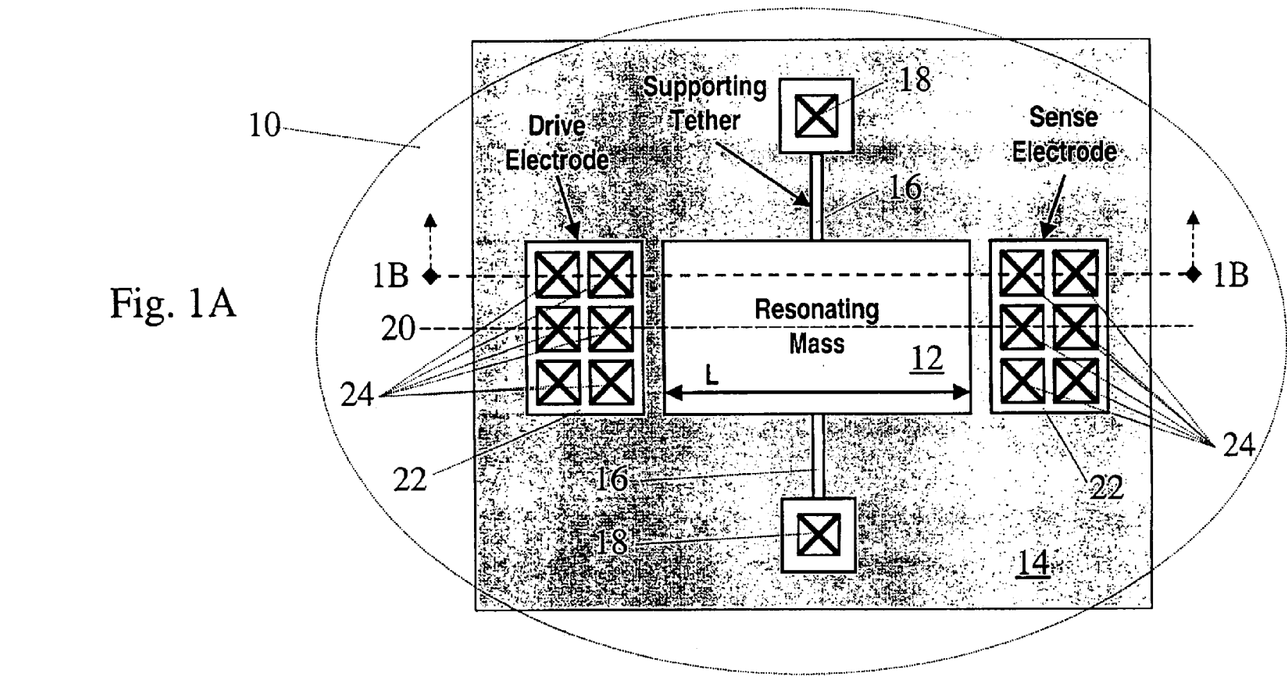
FIGS. 1A, 1B are a plan view and a side view in section of a MEMS resonator in accordance with one embodiment of the invention.
Figure 1B:
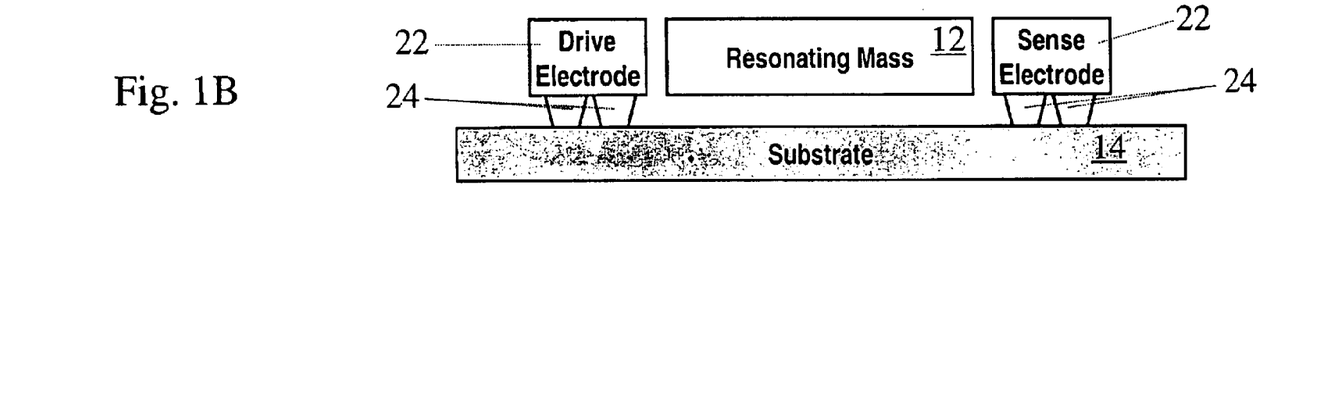

FIGS. 1A and 1B are a plan view and a section view along line 1B—1B of a MEMS resonator 10 in accordance with one embodiment of the invention. The resonator includes a resonating mass 12 supported above a substrate 14 by means of tethers 16 and anchors 18 extending from substrate 14. Resonating mass 12 has a longitudinal axis shown at 20 and a transverse axis (not shown) through tethers 16. Capacitive plates 22 are supported by anchors 24 on substrate 14 and are spaced from opposing end surfaces of resonating mass 12 along longitudinal axis 20.

In preferred embodiments the supporting substrate 14 is silicon and the resonating mass 12 is poly-silicon, polysilicon-germanium, or poly-silicon-carbide for example. Tethers 16 and capacitive plates 22 are electrically conductive whereby a bias voltage can be applied to resonating mass 12 through tether 16, and an input signal and an output signal can be respectively coupled to resonating mass 12 through capacitive plates 22.

Figure 2:
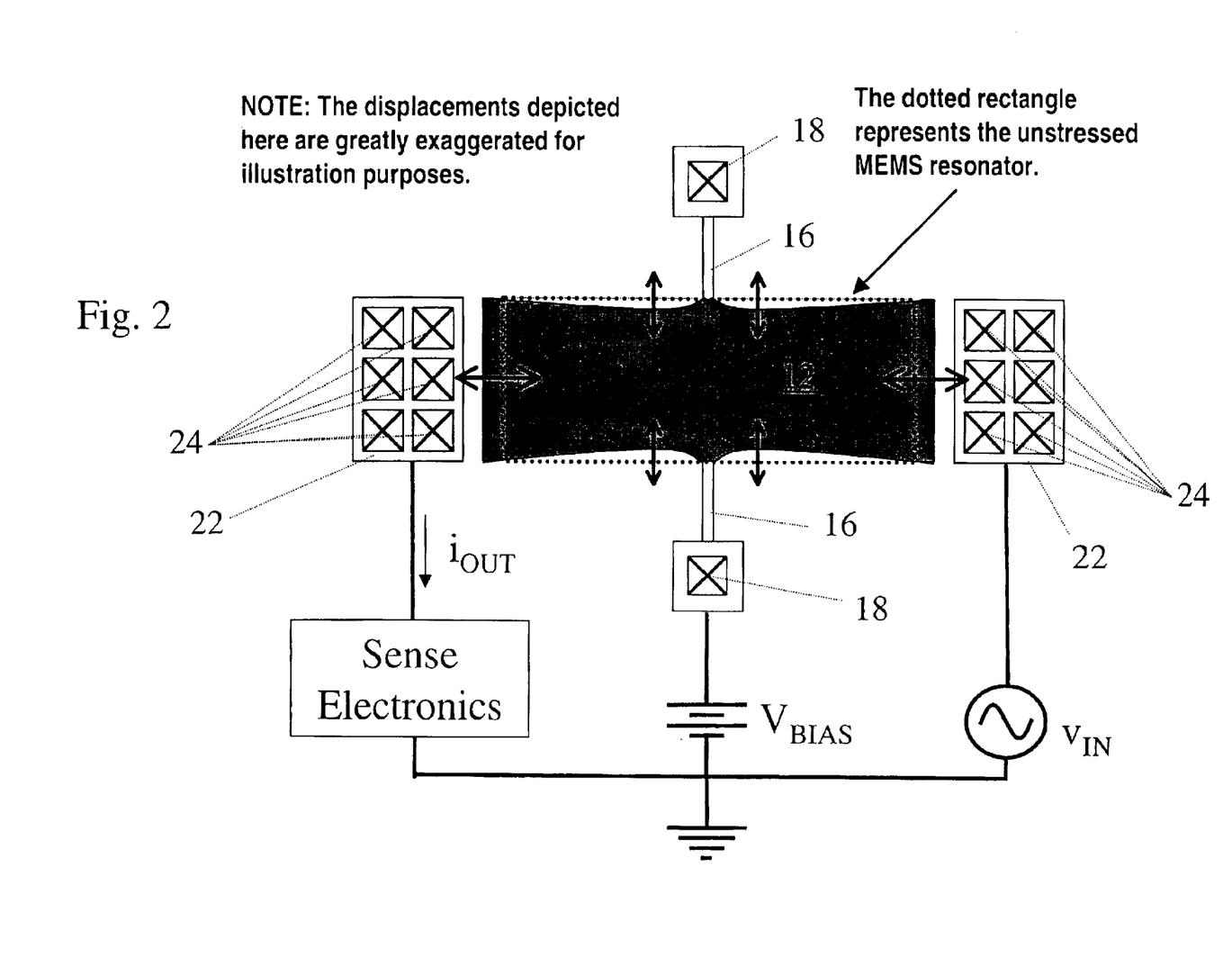
FIG. 2 is a plan view illustrating the operation of the resonator of FIG. 1 in accordance with one embodiment.

In one mode of operation, illustrated in FIG. 2, resonating mass 12 has a DC voltage of 15–30 volts applied thereto via tethers 16, and a high frequency RF input signal is applied to the resonating mass from one end plate 22. Mass 12 resonates at a predetermined frequency as indicated by the arrows, and if the resonating frequency is coupled to the mass by the input plate, the output plate generates a current at the resonant frequency. In this mode of operation the resonator functions as a filter.

Figure 3A:
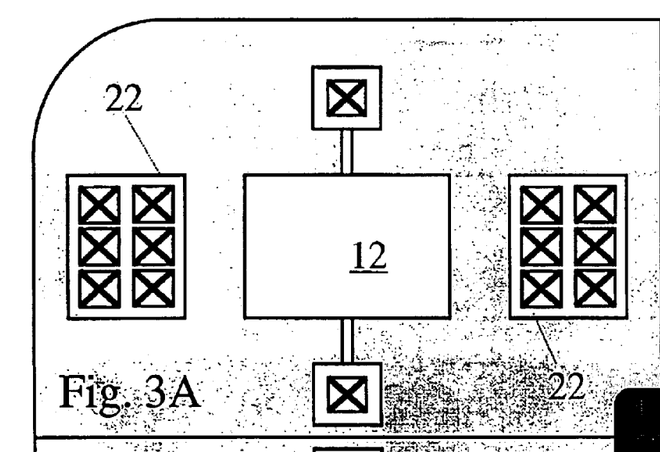
FIGS. 3A–3D are plan views illustrating operation of a resonator similar to that of FIG. 1 in accordance with another embodiment of the invention.
Figure 3B:
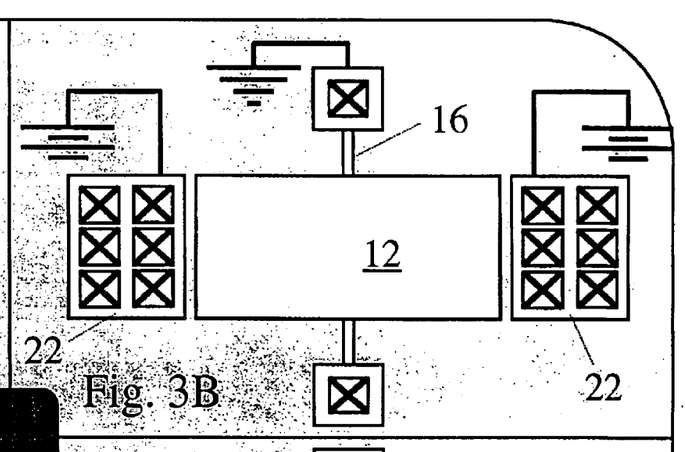
Figure 3C:
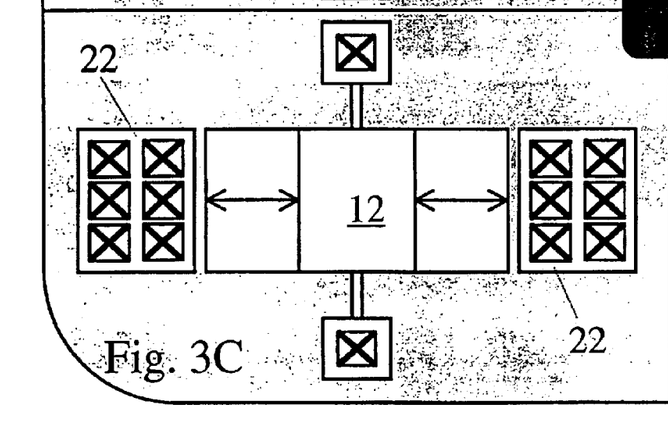
Figure 3D:
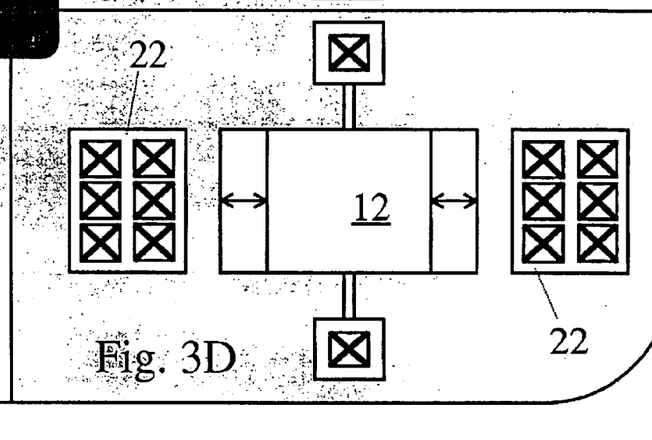

FIGS. 3A–3D illustrate another mode of operation utilizing longitudinal motion of the resonator as a frequency source. FIG. 3A shows a device in a non-active state, and in FIG. 3B resonating mass 12 is grounded through tether 16 while plates 22 receive a positive voltage potential. In FIG. 3C the voltages are removed and mass 12 vibrates longitudinally as indicated by the arrows. Current signals are detected on plates 22 at the resonating frequency of mass 12, and after motion of resonating mass 12 diminishes as shown in FIG. 3D, positive voltages are again applied to the capacitive plates while the mass is grounded to increase the motion of mass 12. In this mode of operation a stable frequency output is provided on plates 22.

Figure 4A:
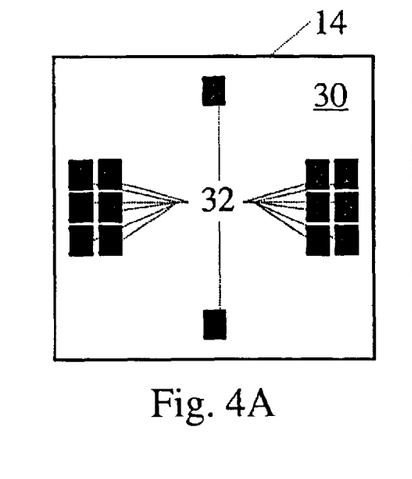
FIGS. 4A–4C are plan views illustrating steps in fabricating the resonator of FIG. 1 in accordance with one embodiment of the invention.

The MEMS resonator of FIG. 1 is readily fabricated using a two-mask self-aligned semiconductor process as illustrated in FIGS. 4A–4C. In FIG. 4A a silicon dioxide layer 30 is formed on a surface of silicon substrate 14 by chemical vapor deposition or thermal oxidation. A first photoresist mask is employed to etch anchor holes 32 through the oxide layer 30 to the underlying substrate 14. Sacrificial materials other than silicon dioxide can be employed such as germanium or photoresist.

Figure 4B:
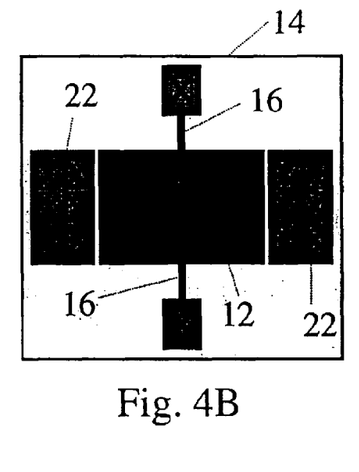
Figure 4C:
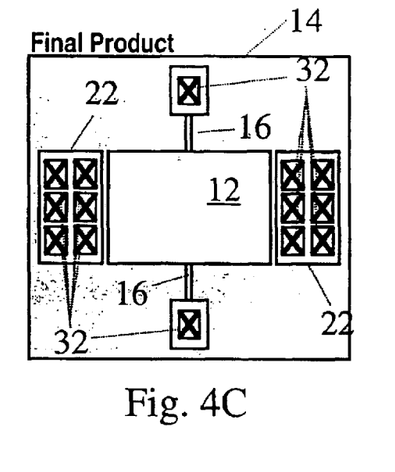

Next, a layer of resonator material is formed over the oxide 30 and in anchor holes 32 by chemical vapor deposition. Preferably, the resonator material is poly-silicon, poly-silicon-germanium ($Si_{0.60}GE_{0.40}$) or poly-silicon-carbide. Other materials such as III-V semiconductor materials, metals, or polymer compounds (either conductive or coated with a conductive material) can be employed. A second mask is then employed to form the resonating mass 12, tethers 16, and capacitive plates 22 as shown if FIG. 4B. While an anisotropic plasma etch is preferably employed in forming the anchor holes in FIG. 4A, a wet isotropic etch such as HF for silicon dioxide is employed in FIG. 4B to remove all underlying silicon dioxide. The final product is shown in FIG. 4C in which resonating mass 12 is spaced above silicon substrate 14 by tethers 16 which are anchored to the substrate at 32. Similarly, capacitive plates 22 are positioned above substrate 14 by anchors 32. The final structure is then annealed to produce a resonating body with a high mechanical quality factor, Q.

The resulting structure has a high Q value (e.g., 10,000 to 100,000 is realistic for materials such as poly-silicon and poly-silicon-germanium in the kHz to GHz frequency range). When excited, dilatational waves are present in three orthogonal directions; however, only those waves in the longitudinal direction are employed in this embodiment. Importantly, there is no anchor loss (to the first order) and the natural frequency, to the first order, is dependent only on the longitudinal length, L, of the resonating body. The cross-sectional area can be altered without significantly changing the natural frequency; therefore, the area can be changed to meet a large range of signal-to-noise ratio requirements. Further, fabrication of the MEMS resonator employs a simple one- or two-mask self-aligned process using conventional semiconductor processing techniques.

Figure 5A:
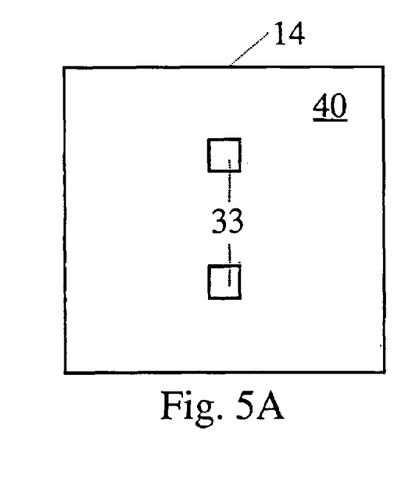
FIGS. 5A–5C are plan views illustrating steps in fabricating a resonator similar to the resonator of FIG. 1 in accordance with another embodiment of the invention.
Figure 5B:
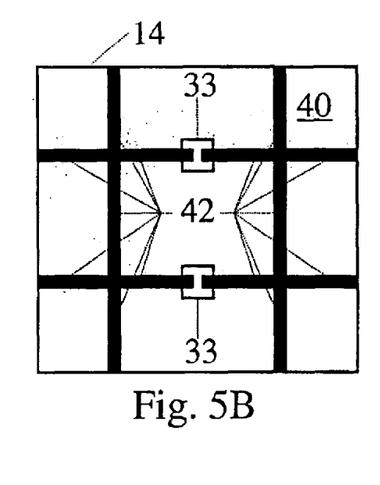
Figure 5C:
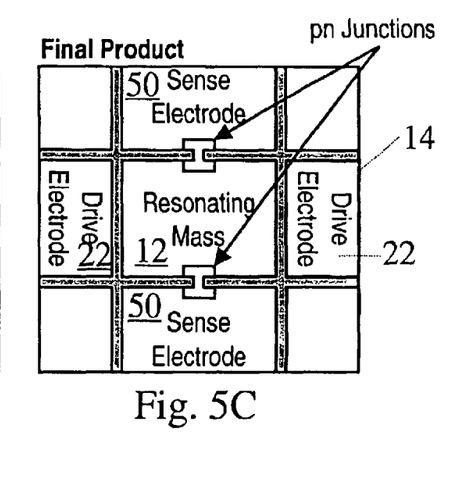

FIGS. 5A–5B are plan views illustrating the fabrication of a MEMS resonator similar to the resonator of FIG. 1. In this embodiment a silicon on insulator (SOI) structure is provided with a substrate and top silicon layer doped either N or P type. In FIG. 5A a dopant is selectively diffused or implanted 33 into the top silicon layer 40, and the wafer is annealed to activate the dopant. The dopant is chosen to be of conductivity opposite to that of the top silicon layer 40, thereby forming P-N junctions between silicon layer 40 and doped regions 33. Next, as shown in FIG. 5B, a grid array 42 is anistropically etched through silicon layer 40. Then, a timed wet isotropic etch is employed to remove the underlying oxide, except at specified points under the drive and sense electrodes, where oxide is allowed to remain for mechanical anchoring. The resulting structure has drive electrodes 22 along the longitudinal axis and sense electrodes 50 along the transverse axis with the P-N junctions providing electrical isolation between the sense electrodes and the resonator mass 12. By using the SOI process, single crystal resonator material can be used which will enhance the Q of the device and significantly lower residual strain gradients and residual stresses.

Figure 6:
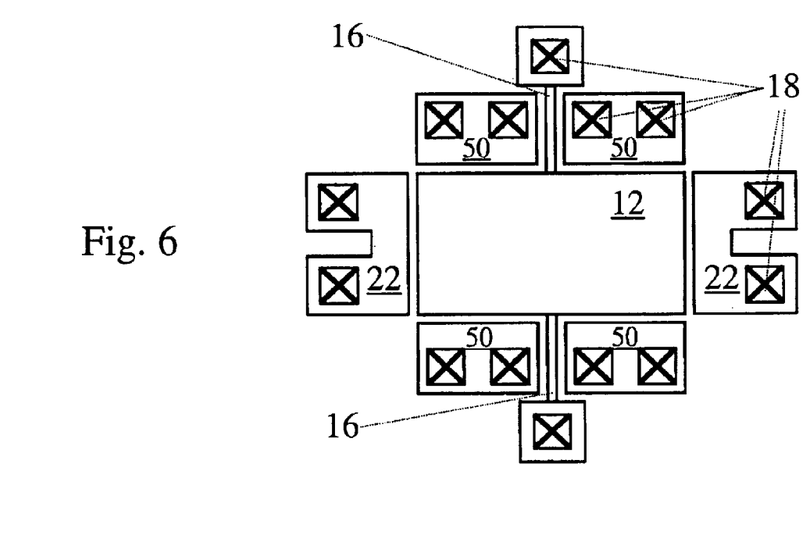
FIG. 6 is a plan view of a MEMS resonator in accordance with another embodiment of the invention.

FIG. 6 is a plan view of another embodiment of the invention which is similar to the embodiment of FIG. 1 and again like reference numerals are used for the same elements. In this embodiment both the longitudinal vibrations and transverse vibrations are employed in detecting output signals. Capacitive plates 22 are again positioned along the longitudinal axis of resonating mass 12 which is supported by tethers 16 to the underlying substrate through anchors 18. In addition, capacitive plates 50 are spaced from the sidewalls of resonating mass 12 to detect the transverse vibration of mass 12. Its operation is very similar to the embodiment presented in FIG. 5.

Figure 7:
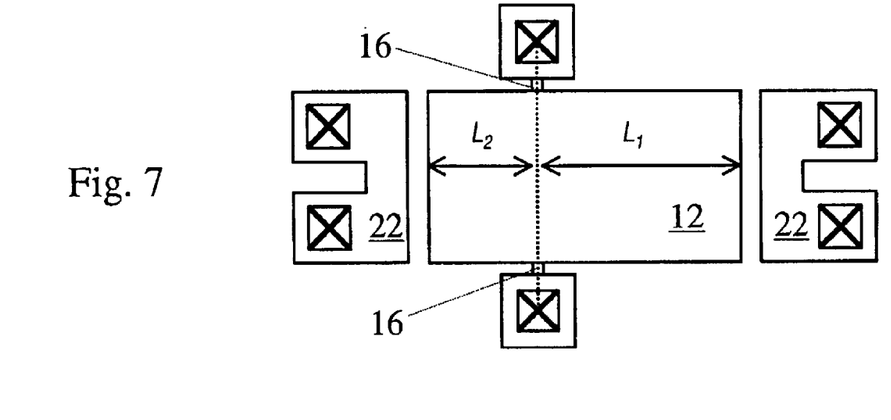
FIG. 7 is a plan view of a MEMS resonator in accordance with another embodiment of the invention.

FIG. 7 is a plan view of another embodiment of the MEMS resonator which is similar to the embodiment of FIG. 1 but in which tethers 16 are offset from the center of resonating mass 12. This embodiment is more sensitive to alignment errors which can create uncompensated moments and create an additional torsion mode. Further, large anchor loss can be experienced if the resonator center of mass moves significantly. However, the embodiment illustrates a different application of the MEMS resonator.

The resonating frequency of the mass can be roughly approximated by the following uniaxial equation:

$$\omega_n = \frac{\pi}{L}\sqrt{\frac{E}{\rho}}(2n-1)$$

L=Total Length of Resonator
E=Young's Modulus of Structural Material
$\rho$=Mass Density of Structural Material
n=Mode Number (n=1→primary mode)
$\omega_n$=(frequency (in rad/s) of mode n
$f_n$=frequency (in Hz) of mode n Using this equation the resonating frequency for a MEMS resonator similar to the embodiment in FIG. 1 with length L of 1 µm is

| Material | Frequency |
|---|---|
| Poly-SiGe | 3.0 GHz |
| Poly-Si | 4.3 GHz |
| Poly-SiC | 6.0 GHz |

The variation of frequency, $f_1$, with length, L, for polysilicon is as follows:

| L(µm) | $f_1$(GHz) |
|---|---|
| 20 | 0.21 |
| 10 | 0.43 |
| 5 | 0.85 |
| 1 | 4.27 |
| 1.78 | 2.40 |

Figure 8A:
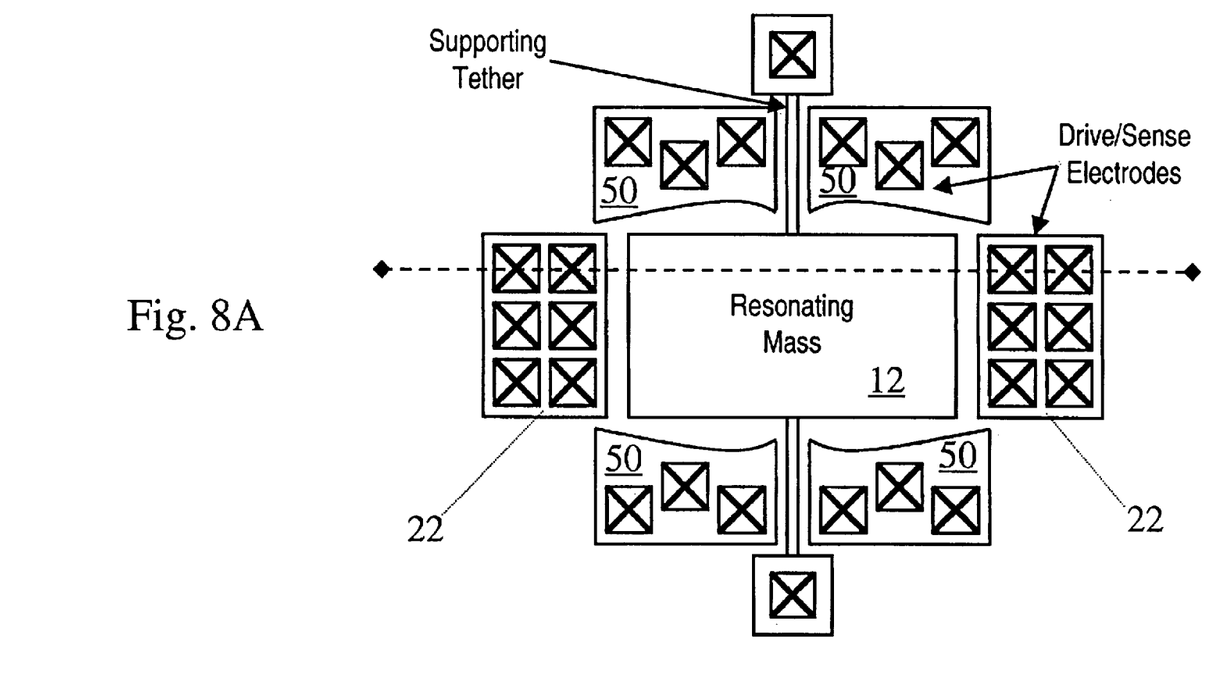
FIGS. 8A, 8B are a plan view and a side view in section of a MEMS resonator in accordance with another embodiment of the invention.
Figure 8B:
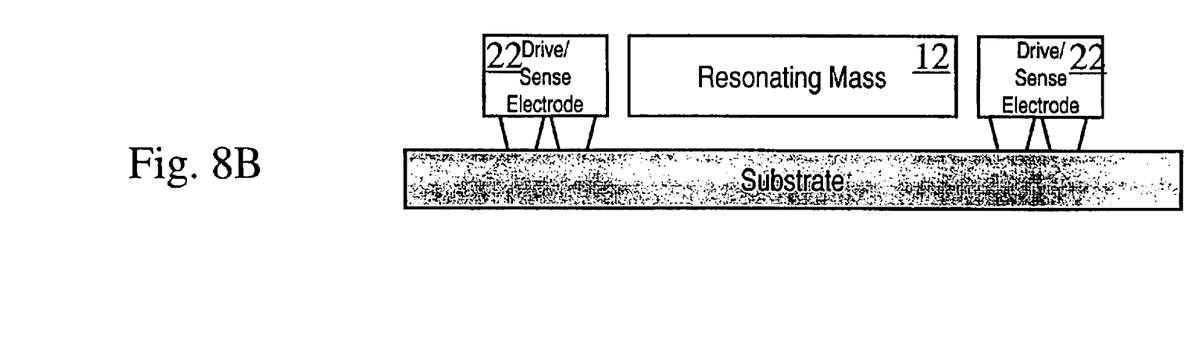

In accordance with another feature of the invention, the transverse capacitive plates can be shaped or contoured to match the shape of the mode of vibration of the resonating mass. For example, in the embodiment of FIG. 6, the transverse capacitive plates 50 are shaped as shown in FIGS. 8A, 8B in order to tailor the distribution of the excitation force intensity. Note in FIG. 8A that the resonating mass 12 remains rectangular in shape while capacitive plates 50 are shaped along the surfaces facing resonating mass 12 to match the shape of the mode of vibration. The resonating mass can also be shaped such that it has a two-dimensionally varying cross-section. However, a varying cross-section greatly complicates theoretical calculations of the resonant frequencies and mode shapes.

The resonating body 12 is assumed to be composed of an isotropic elastic material, and it is assumed that the amplitudes of vibration are small enough so that a linear analysis captures its dynamics. If the length of the resonating mass or bar is much longer than its thickness, then a simple uniaxial model can be used. This model predicts that the bar will vibrate only in the longitudinal direction. The resonant frequencies predicted by the uniaxial model were given in paragraph [30]. In order to more accurately determine the mode shape and frequency of the resonating mass, a rod theory which accommodates coupled longitudinal-lateral vibrations was used, see for instance O'Reilly "On Coupled Longitudinal and Lateral Vibrations of Elastic Rods," *Journal of Sound and Vibration*, Vol. 247, pp. 835–856, 2001. In the following analysis, based on this more elaborate theory, it is assumed that the resonating mass is composed of poly-silicon-germaniun (poly-$Si_{0.60}Ge_{0.40}$). For this material, Young's modulus E, Poisson's ratio ν, and the mass density (per unit volume) $\rho_0$ are $$E=156.6 \text{ GPa}, \nu=0.244, \rho_0=3526 \text{ kg/m}^3. \quad (1)$$

Figure 9:
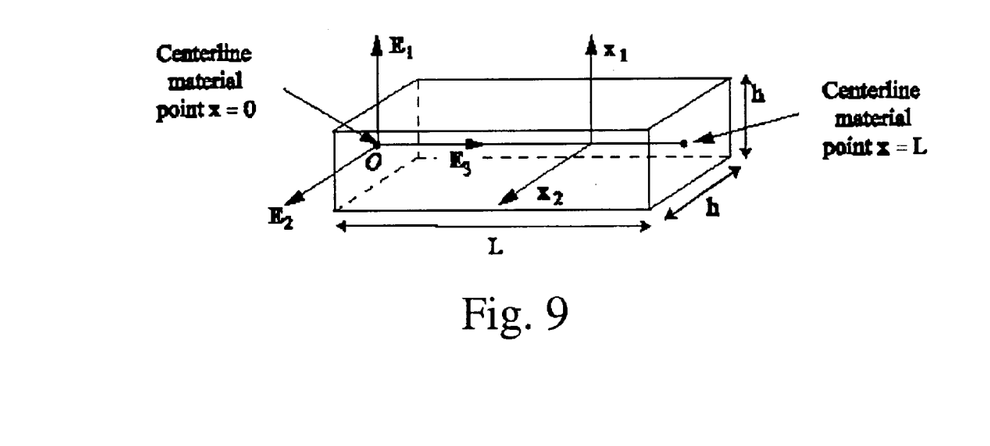
FIG. 9 illustrates the coordinates used to measure the vibration displacement of a resonating mass with a square cross-section in accordance with one embodiment of the invention.

As shown in FIG. 9, let x be the arc-length coordinate of the centerline of the bar in a fixed state. We use coordinates $x_1$ and $x_2$ to identify points in the cross-sections of the rod. During the motions of interest, the displacement of any point of the parallelepiped is assumed to be $$u(x,t)=(U(x)E_3+V(x)(x_1E_1+x_2E_2))(A \cos(\omega t)+B \sin(\omega t)). \quad (2)$$

Here, A and B are constants, and ω is the frequency. We shall call U the axial displacement and V the lateral displacement.

In other words, U(x) is the displacement of the points of the centerline of the bar in the direction of this line (i.e., in the direction of $E_3$). The deformation of interest is only assumed to depend on x and t.

Figure 10:
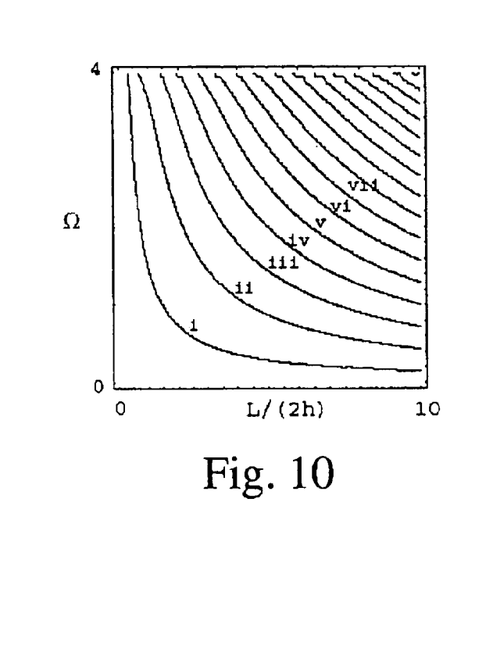
FIG. 10 is a graph illustrating the natural frequencies of the resonating mass of FIG. 9 as a function of the ratio of longitudinal length to height.

Next, we use the rod theory discussed previously to determine the natural frequencies of the motions (2). Omitting details, the first fifteen natural frequencies for the resonator are shown in FIG. 10. The frequency Ω in this figure is $$\Omega = \omega\left(\frac{h}{c_d}\right) \quad (3)$$

where the dilatational wave velocity $c_d$ is $$c_d = \sqrt{\frac{E}{\rho_0}\frac{(1-\nu)}{(1+\nu)(1-2\nu)}} \quad (4)$$

The resonator design illustrated in FIG. 8 is based on the curve marked "i" in FIG. 10. If we imagine staying on this curve, and fixing the height h resonating mass, then making the mass longer (increasing L) will decrease the resonant frequency and vice versa. Also note that, as the resonating mass gets very long then the effects of varying h on the resonant frequency diminishes.

Based on a height h of 3 microns, the material properties listed above, and the motions (2), if one wishes a resonator with a first resonant frequency of ω=20 MHz, then our calculations show that the resonator would have a length L of 166.76 microns. For the same frequency, if we change h to 4 microns, then L=166.81 microns. While, if we change h to 5 microns, then L=166.85 microns. The reason for this insensitivity to h is that we are on the curve "i" in FIG. 10 where L/(2h) is large.

Figure 11:
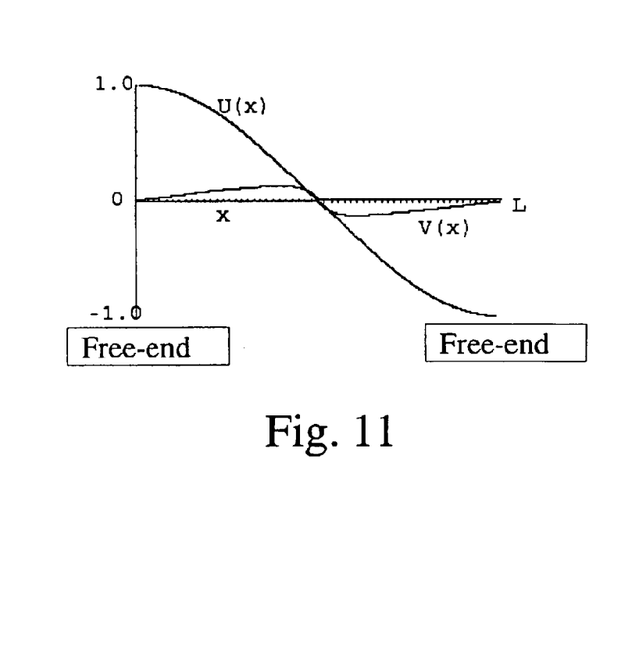
FIG. 11 is a graph illustrating the longitudinal component $U(x)$ of the mode shape of vibration of the resonating mass of FIG. 9.

Alternatively, if a resonator with a frequency of 200 MHz is required, then the analysis shows that the parallelepiped needs to have the dimensions L=16.80 microns and h=3 microns. The mode shape corresponding to this vibration is shown in FIG. 11. For a 2.4 GHz resonator where h=1 micron, L=1.42 microns. In addition, the mode shape will be similar to that shown in FIG. 11.

The following features of the mode shown in FIG. 11 are important to observe. First, the maximum axial displacement U occurs at the free-ends, while the maximum lateral displacement V occurs close to the mid-point of the mass. This will help reduce the anchor losses. In addition, at the ends of the bar, the lateral displacements are two orders of magnitude lower than the axial displacement. This will help to minimize any cross-coupling between the capacitive plates. Finally, the electrodes 22 in FIG. 8 will be used to actuate/sense the U displacement, while electrodes 50 will be used to actuate/sense the V displacement.

Figure 8C:
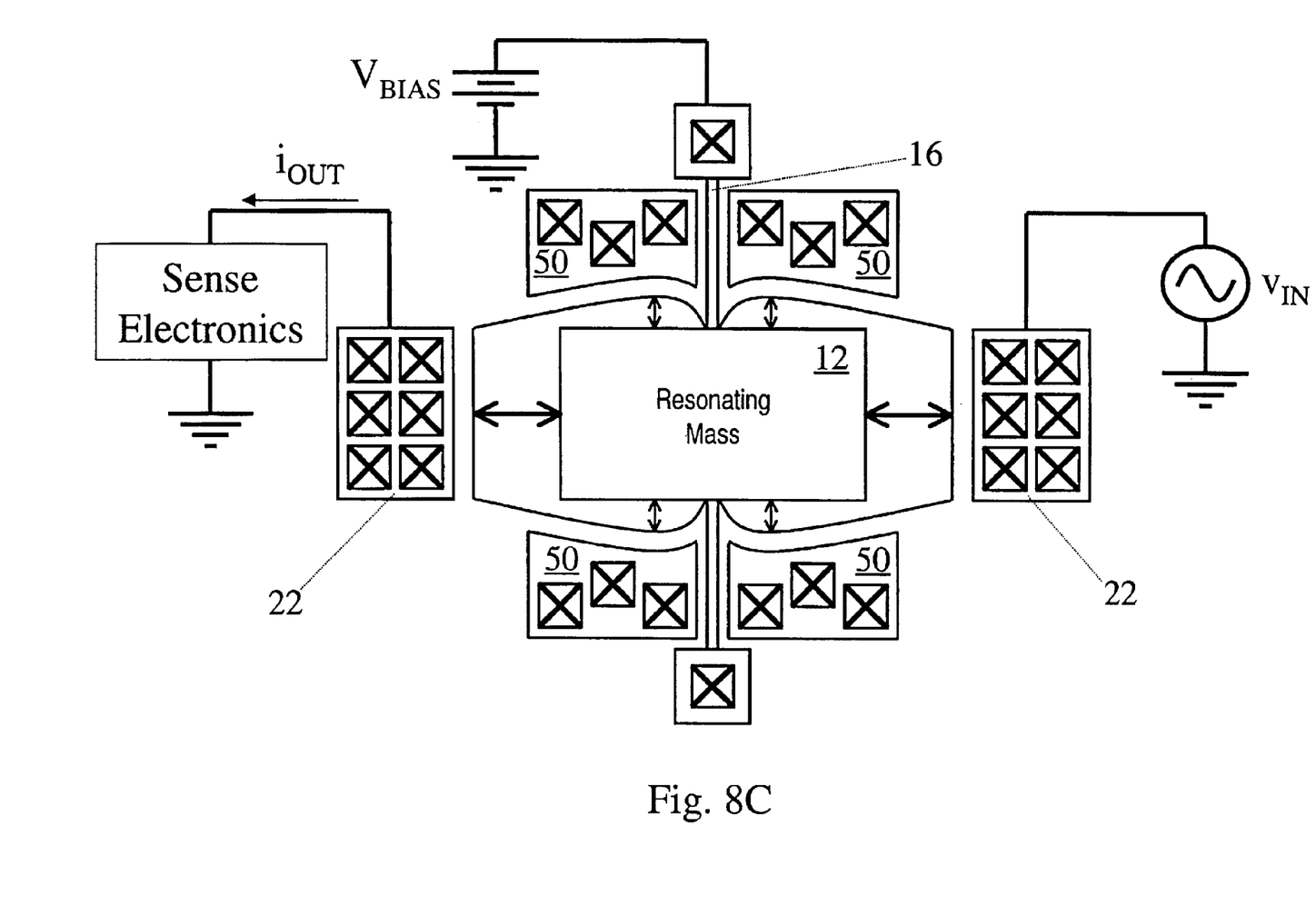
FIG. 8C is a plan view illustrating the operation of this embodiment.

In practicing this embodiment, a scheme similar to that of FIG. 2 is employed. As shown in FIG. 8C, a DC bias voltage is applied to the resonating mass 12 through tether 16. The signal voltage is fed into the resonator through electrodes 22 and/or 50, and the output current is sensed through the un-driven electrodes, 50 and/or 22. Other actuation schemes are possible, such as a scheme similar to that depicted in FIG. 3.

In contrast to other MEMS resonator embodiments, this embodiment exploits the three-dimensional nature of the vibration of the resonant mass. Specifically, the resonant mass vibrates longitudinally and laterally. This coupling is exploited by shaping the drive and sense electrodes in order to shape the driving/sensing electric field. This allows one to tailor the distribution of the excitation force intensity, and effectively excite/sense the vibrations of the resonant mass. The extra pair of drive/sense electrodes potentially enables a dual-pole filter or four-port electrical component.

If possible, it would be advantageous and preferable to add another pair of drive/sense electrodes above and below the resonating mass 12. This would allow for three different sets of independent drive/sense electrodes to work in conjunction, potentially enabling tri-pole filter design and/or a six-port MEMS resonator.

A MEMS resonator in accordance with the invention is readily fabricated in an integrated circuit with other electronic components in a signal receiver, for example, particularly in a wireless RF communication system. The resonator has low power consumption and does not degrade the accompanying electronics. The self-aligned two-mask process in fabricating the resonator is readily implemented with few if any asymmetries in the device layout. The natural frequency of the resonator is not a function of the cross-sectional area to first order and thus is relatively insensitive to process variations and less sensitive to environmental variations. Several resonators tuned to different frequencies can be placed in parallel to increase the pass band of received electronic signals.

While the invention has been described with reference to specific embodiments, the description is illustrative of the invention and is not to be construed as limiting the invention. For example, the cross-sections of the resonator need not be rectangular as other shapes can be used such as circular, ellipsoidal, triangular, and trapezoidal, for example. Various modifications and applications may occur to those skilled in the art without departing from the true spirit and scope of the invention as defined by the appended claims.

What is claimed is:

1. A microelectromechanical system (MEMS) resonator comprising:
   a) a supporting substrate,
   b) a resonating mass having a longitudinal axis and a bulk mode of vibration and arbitrary cross-section along this longitudinal axis,
   c) first and second rigid tethers supporting the resonating mass from opposing sides of the resonating mass above the substrate without imparting any spring forces on the resonating mass, the tethers being aligned perpendicular to the longitudinal axis, and
   d) first capacitive plates anchored to the substrate coplanar with the resonating mass and aligned along the longitudinal axis and spaced from and capacitively coupled to end surfaces of the resonating mass for providing a first resonator input and output for exciting and for detecting the bulk mode of vibration of the resonating mass.

2. The MEMS resonator as defined by claim 1 and further including second capacitive plates anchored on the substrate along a transverse axis and spaced from and capacitively coupled to side surfaces of the resonating mass for providing a second resonator input and output.

3. The MEMS resonator as defined by claim 2, wherein the resonating mass comprises a semiconductor material.

4. The MEMS resonator as defined by claim 3, wherein the substrate comprises a semiconductor material.

5. The MEMS resonator as defined by claim 4, wherein the resonating mass comprises polycrystalline silicon.

6. The MEMS resonator as defined by claim 4 wherein the resonating mass comprises a polycrystalline silicon-germanium alloy.

7. The MEMS resonator as defined by claim 4, wherein the resonating mass comprises polycrystalline silicon-carbide.

8. The MEMS resonator as defined by claim 1, wherein the resonating mass comprises a compound semiconductor material.

9. The MEMS resonator as defined by claim 1, wherein the resonating mass comprises a semiconductor material.

10. The MEMS resonator as defined by claim 9, wherein the substrate comprises a semiconductor material.

11. The MEMS resonator as defined by claim 10, wherein the resonating mass comprises polycrystalline silicon.

12. The MEMS resonator as defined by claim 10, wherein the resonating mass comprises polycrystalline silicon-germanium alloy.

13. The MEMS resonator as defined by claim 10, wherein the resonating material comprises polycrystalline silicon-carbide.

14. The MEMS resonator as defined by claim 10, wherein the resonating mass comprises a compound semiconductor material.

15. The MEMS resonator as defined by claim 1, wherein the resonating mass has a rectangular cross-section along the longitudinal axis.

16. The MEMS resonator as defined by claim 1, wherein the resonating mass has a trapezoidal cross-section along the longitudinal axis.

17. The MEMS resonator as defined by claim 1, wherein the resonating mass has an ellipsoidal cross-section along the longitudinal axis.

18. The MEMS resonator as defined by claim 1, wherein the resonating mass has a circular cross-section along the longitudinal axis.

19. The MEMS resonator as defined by claim 1, wherein the resonating mass has a triangular cross-section along the longitudinal axis.

20. The MEMS resonator as defined by claim 1 wherein the resonating mass, supporting tethers, and capacitive plates are composed of an electrically conductive material, alloy, or composite.

21. The MEMS resonator as defined by claim 1, wherein the first and second tethers are electrically conductive for applying a voltage to the resonating mass.

22. The MEMS resonator as defined by claim 1 and further including N (where N>1) capacitive plates anchored on the substrate along transverse axes and spaced from side surfaces of the resonating mass for providing a total of (N+1) resonator inputs and outputs.

23. The MEMS resonator as defined by claim 22, wherein the N capacitive plates are contoured to match the shape of the mode of vibration of side surfaces of the resonating mass.

* * * * *